United States Patent
Harasaki

(10) Patent No.: US 11,952,026 B2
(45) Date of Patent: Apr. 9, 2024

(54) CONVEYANCE VEHICLE SYSTEM

(71) Applicant: MURATA MACHINERY, LTD., Kyoto (JP)

(72) Inventor: Kazumi Harasaki, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 534 days.

(21) Appl. No.: 17/271,633

(22) PCT Filed: Jul. 11, 2019

(86) PCT No.: PCT/JP2019/027597
§ 371 (c)(1),
(2) Date: Feb. 26, 2021

(87) PCT Pub. No.: WO2020/049872
PCT Pub. Date: Mar. 12, 2020

(65) Prior Publication Data
US 2021/0179153 A1    Jun. 17, 2021

(30) Foreign Application Priority Data

Sep. 4, 2018 (JP) .................................. 2018-165288

(51) Int. Cl.
*B61L 27/30* (2022.01)
*G05B 19/418* (2006.01)

(52) U.S. Cl.
CPC ........ *B61L 27/30* (2022.01); *G05B 19/41895* (2013.01); *G05B 2219/31454* (2013.01)

(58) Field of Classification Search
CPC .............. B61L 27/30; G05B 19/41895; G05B 2219/31454

USPC .......................................................... 701/19
See application file for complete search history.

(56) References Cited

U.S. PATENT DOCUMENTS

| | | | | |
|---|---|---|---|---|
| 5,797,330 A | * | 8/1998 | Li | B61B 13/06 |
| | | | | 701/19 |
| 9,758,308 B1 | * | 9/2017 | Nishikawa | H01L 21/67727 |
| 11,390,461 B2 | * | 7/2022 | Heggebø | B65G 1/1375 |
| 2009/0000505 A1 | | 1/2009 | Shimamura et al. | |
| 2010/0049383 A1 | * | 2/2010 | Atmur | B61L 27/00 |
| | | | | 701/19 |
| 2013/0236279 A1 | * | 9/2013 | Franzen | B65G 63/004 |
| | | | | 180/167 |

(Continued)

FOREIGN PATENT DOCUMENTS

JP    2009-009365 A    1/2009

*Primary Examiner* — Manglesh M Patel
(74) *Attorney, Agent, or Firm* — Keating & Bennett, LLP

(57) ABSTRACT

A transport vehicle system includes a track, transport vehicles, placement units to deliver or receive articles, and area controllers that each receive a conveyance instruction from a host controller and control a transport vehicle in a jurisdiction area to execute various instructions. The area controller, in response to receiving from the host controller a conveyance instruction destined for one special placement unit belonging to a jurisdiction area, transmits to another area controller a movement instruction to control an empty transport vehicle to move toward the jurisdiction area, and also controls an empty transport vehicle that has become available in the jurisdiction area after transmission of the movement instruction to execute the conveyance instruction.

10 Claims, 7 Drawing Sheets

(56) References Cited

U.S. PATENT DOCUMENTS

| | | | |
|---|---|---|---|
| 2015/0110585 A1* | 4/2015 | Ota | B65G 1/0457 |
| | | | 414/222.13 |
| 2015/0336472 A1* | 11/2015 | Tanaka | B60L 13/006 |
| | | | 104/118 |
| 2017/0283182 A1* | 10/2017 | Maejima | H01L 21/67733 |
| 2018/0024554 A1* | 1/2018 | Brady | G06Q 10/0833 |
| | | | 701/23 |
| 2018/0057261 A1* | 3/2018 | Takagawa | B65G 1/0492 |

\* cited by examiner

Fig.2
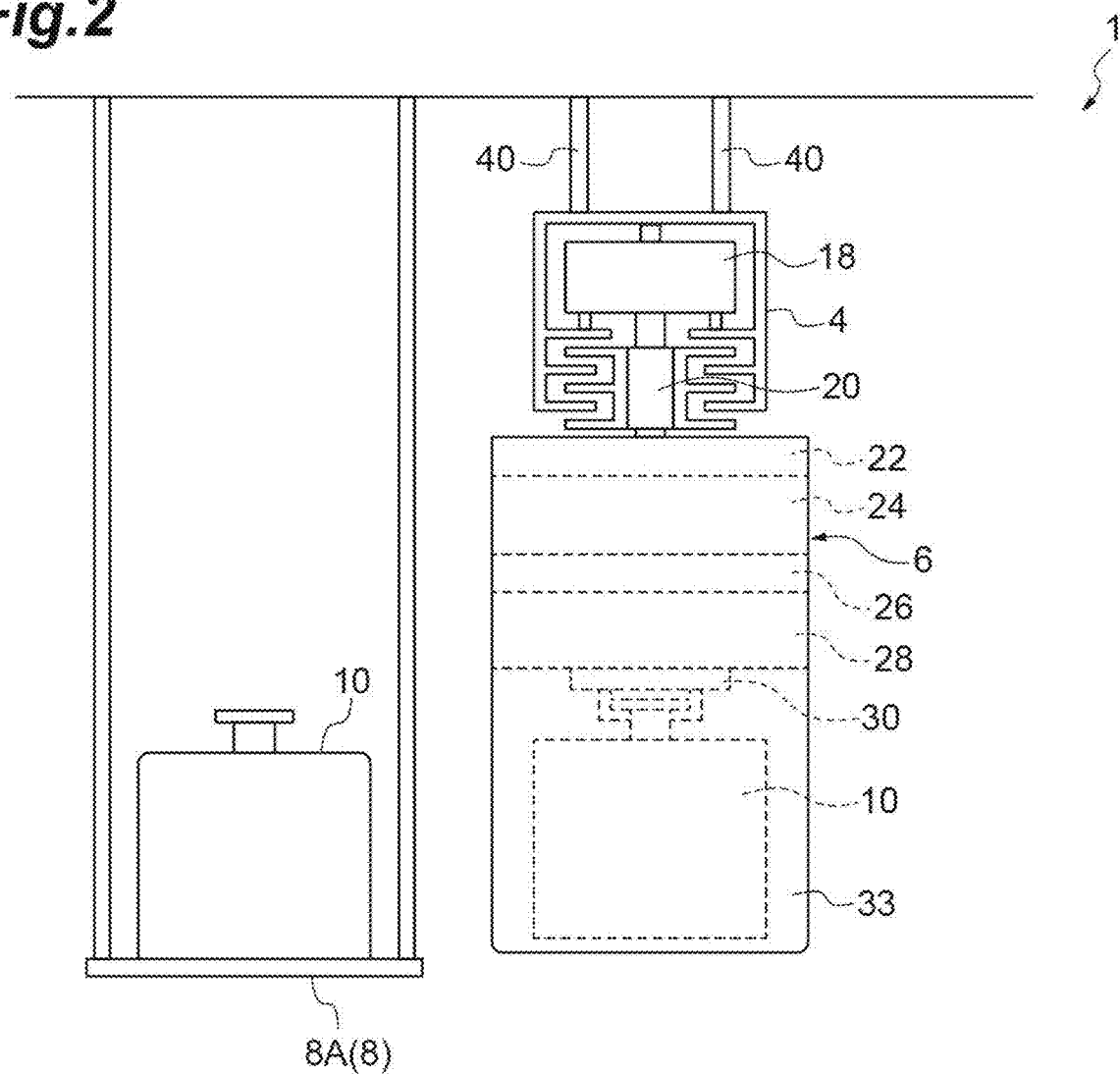
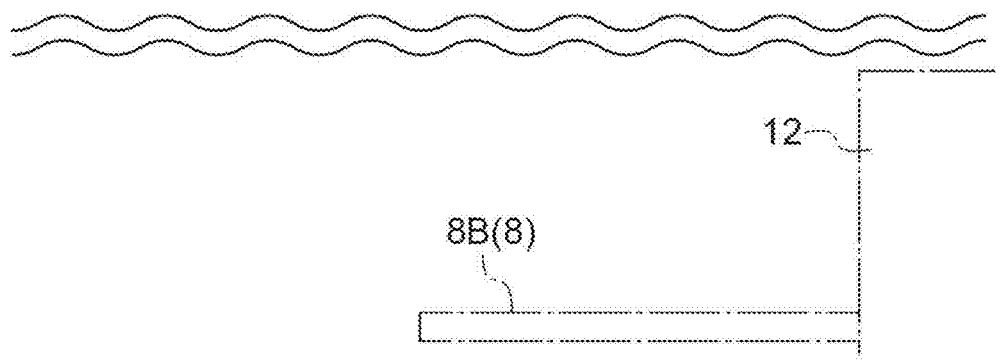

CONVEYANCE VEHICLE SYSTEM

BACKGROUND OF THE INVENTION

1. Field of the Invention

The present invention relates to a transport vehicle system.

2. Description of the Related Art

As a conventional transport vehicle system, a transportation carriage system includes a track that extends over a plurality of areas, a plurality of overhead transport vehicles (transport vehicles) configured to travel in one direction along the track, a plurality of placement units (buffers) configured for each transport vehicle to deliver or receive an article thereto or therefrom, a plurality of area controllers (logic bay controllers) each configured to consider the corresponding one of the areas as a jurisdiction area and cause a transport vehicle in the jurisdiction area to execute various instructions, and a host controller (production controller) configured to transmit conveyance instructions to the area controllers is known (see Japanese Unexamined Patent Publication No. 2009-9365, for example).

In the system configured to control various operations of the transport vehicles individually for the areas as described above, an area boundary exists between one jurisdiction area and another jurisdiction area different from the one jurisdiction area. In one jurisdiction area, a special section that cannot be entered without passing through another jurisdiction area may exist. If a conveyance instruction the conveyance source of which is a placement unit belonging to such a special section is issued, this conveyance instruction cannot be handled efficiently, and the handling time for a transport vehicle to reach the placement unit to be loaded with an article tends to increase.

SUMMARY OF THE INVENTION

Preferred embodiments of the present invention provide transport vehicle systems that are each able to efficiently handle conveyance instruction, even when conveyance instructions are provided by placement units that belong to special sections.

A transport vehicle system according to a preferred embodiment of the present invention includes a track that extends over a plurality of areas, a plurality of transport vehicles that are able to travel in one direction along the track, a plurality of placement units provided along the track to deliver or receive an article to or from the placement units for each transport vehicle, a plurality of area controllers that each receive, from a host controller, a conveyance instruction to convey an article placed on one of the placement units, determine the corresponding one of the areas as a jurisdiction area, and control the transport vehicle in the jurisdiction area to execute various instructions. When, in one jurisdiction area, the placement unit belonging to a special section being a section that is unable to be entered without passing through a second jurisdiction area different from the one jurisdiction area is considered as a special placement unit, each area controller, in response to receiving from the host controller the conveyance instruction destined for the one special placement unit belonging to a first jurisdiction area that is a jurisdiction area of the area controller, transmits a movement instruction to control an empty transport vehicle to move toward the first jurisdiction area to another area controller configured to control the transport vehicle in the second jurisdiction area, and also controls an empty transport vehicle that has become available in the first jurisdiction area after transmission of the movement instruction to execute the conveyance instruction.

There is a situation in which, even after receiving a conveyance instruction the conveyance source of which is a special placement unit belonging to a first jurisdiction area, its area controller is not able to immediately control a transport vehicle to move to the special placement unit for loading. Thus, in a conventional transport vehicle system, the host controller transmits the conveyance instruction to another area controller having jurisdiction over another area, and this other area controller controls an empty transport vehicle in a second jurisdiction area to execute the conveyance instruction. However, in this case, even if an empty transport vehicle has become available in the special section of the first jurisdiction area before a transport vehicle in the second jurisdiction area reaches the special placement unit, the other area controller that has received the conveyance instruction is not able to control the transport vehicle in the first jurisdiction area over which it has no jurisdiction. Thus, the transport vehicle in the first jurisdiction area instead passes by the special placement unit even though the transport vehicle is an empty transport vehicle. Accordingly, a problem arises in which the conveyance efficiency is significantly reduced, and the handling time is significantly increased. The term "empty transport vehicle" herein indicates a transport vehicle that is loaded with no article and is able to be loaded with (is able to convey) an article.

According, in the transport vehicle system described above, when a conveyance instruction the conveyance source of which is a special placement unit in one area has been issued, the host controller transmits the conveyance instruction to an area controller having jurisdiction over an area to which the special placement unit belongs first, instead of transmitting the conveyance instruction to an area controller of another area to which the special placement unit does not belong. The area controller that has received the conveyance instruction transmits, to another area controller, a movement instruction to cause an empty transport vehicle to move toward the first jurisdiction area. Thus, the area controller having jurisdiction over the area to which the special placement unit belongs is able to control a transport vehicle in the first jurisdiction area to execute the conveyance instruction, and the conveyance instruction is able to be assigned to both of a transport vehicle (a transport vehicle in a second jurisdiction area) that is going to enter the first jurisdiction area in accordance with the preceding movement instruction and an empty transport vehicle that becomes available in the first jurisdiction area. Therefore, a reduction of the conveyance efficiency described above is able to be significantly reduced or prevented, and thus even when a conveyance instruction the conveyance source of which is a placement unit belonging to a special section has been issued, this conveyance instruction is able to be handled efficiently.

In the transport vehicle system according to a preferred embodiment of the present invention, the empty transport vehicle in the first jurisdiction area to be detected by the area controller after the transmission of the movement instruction may be an empty transport vehicle that enters the first jurisdiction area from the second jurisdiction area or an empty transport vehicle that becomes available by placing an article onto the special placement unit belonging to the first jurisdiction area.

In a transport vehicle system according to a preferred embodiment of the present invention, the area controller may delete the movement instruction transmitted to the other area controller after controlling the empty transport vehicle that has become available in the first jurisdiction area to execute the conveyance instruction. Accordingly, at the time when an empty transport vehicle has become available in the first jurisdiction area, movement of an empty transport vehicle traveling toward the first jurisdiction area is able to be canceled, and thus influence on the conveying capability in the other area is able to be significantly reduced.

In a transport vehicle system according to a preferred embodiment of the present invention, the area controller is able to detect whether an empty transport vehicle is present in the first jurisdiction area before transmitting the movement instruction to the other area controller. Accordingly, before transmitting the movement instruction to the other area controller, a necessity of the movement instruction is able to be checked, and thus influence on the conveying capability in the other area is able to be reduced or minimized.

In a transport vehicle system according to a preferred embodiment of the present invention, the area controller may detect whether an empty transport vehicle is present in the first jurisdiction area and upstream of the one special placement unit before transmitting the movement instruction to the other area controller. Accordingly, a check range of the necessity to transmit the movement instruction to the other area controller is able to reduced or minimized, and thus the handling speed is able to be improved.

According to preferred embodiments of the present invention, even when a conveyance instruction the conveyance source of which is a placement unit belonging to a special section has been issued, the conveyance instruction is able to be handled efficiently.

The above and other elements, features, steps, characteristics, and advantages of the present invention will become more apparent from the following detailed description of the preferred embodiments with reference to the attached drawings.

BRIEF DESCRIPTION OF THE DRAWINGS

FIG. 2 is a schematic side view illustrating a transport vehicle, a delivery port, and a buffer of the transport vehicle system shown in FIG. 1.

DETAILED DESCRIPTION OF THE PREFERRED EMBODIMENTS

Preferred embodiments of the present invention will now be described in detail with reference to the drawings. In description of the drawings, like elements are designated by like reference signs, and duplicate description is omitted. The terms "upstream" and "downstream" used in the description of preferred embodiments of the present invention mean upstream and downstream in a traveling direction in which overhead transport vehicles (transport vehicles) 6 move along a one-way (unidirectional) track 4.

Figure 1:
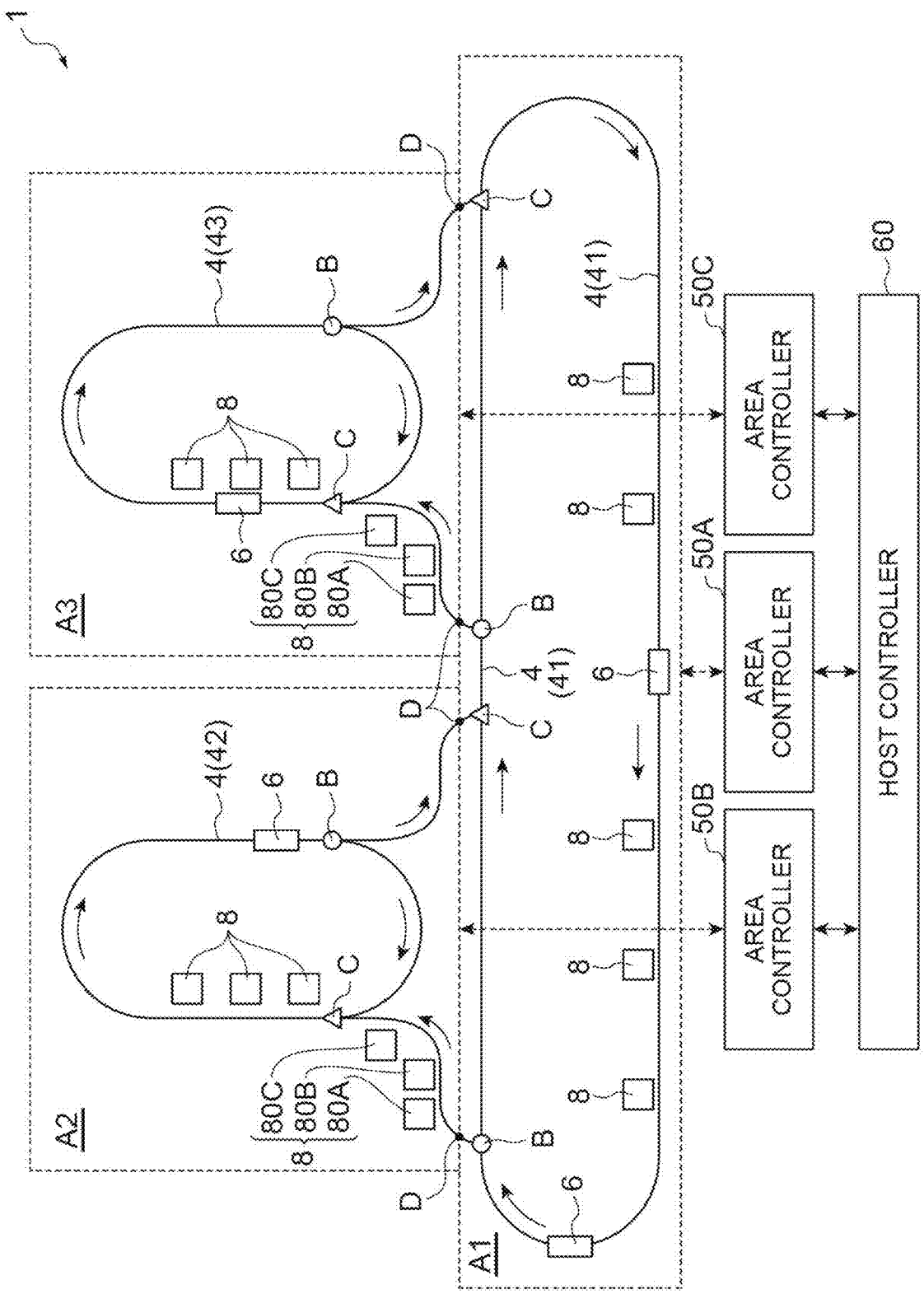
FIG. 1 is a schematic plan view illustrating a transport vehicle system according to a preferred embodiment of the present invention.

As illustrated in FIG. 1 and FIG. 2, a transport vehicle system 1 is a system in which the overhead transport vehicles 6 are able to move along the track to convey articles 10 between placement units 8, 8. Examples of the articles 10 include containers, for example, a FOUP that stores a plurality of semiconductor wafers and a reticle pod that stores glass substrates, and general parts. The following describes an example of the transport vehicle system 1 in a factory, for example, in which the overhead transport vehicles 6 (hereinafter, simply called "transport vehicles 6") travel along the one-way track 4 installed on, for example, a ceiling of the factory. As illustrated in FIG. 1, the transport vehicle system 1 includes the track 4, the transport vehicles 6, a plurality of placement units 8, and a plurality of area controllers 50A, 50B, 50C.

The track 4 extends over a plurality of areas A1, A2, A3. The track 4 is installed near the ceiling in a space overhead of an operator, for example. The track 4 is suspended from the ceiling, for example. The track 4 is a predetermined traveling path for the transport vehicles 6 to travel. The track 4 is supported by posts 40, 40.

Each transport vehicle 6 travels along the track 4 to convey an article 10. The transport vehicle 6 is able to transfer the article 10. The transport vehicle 6 is an overhead-traveling automated guided transport vehicle. The number of the transport vehicles 6 that the transport vehicle system 1 includes is not limited to a particular number, and is preferably two or more, for example.

As illustrated in FIG. 2, each transport vehicle 6 includes a traveling device 18 that moves the transport vehicle 6 along the track 4 and a power-receiving communicator 20 that receives electric power from the track 4 by noncontact feeding, for example. The transport vehicle 6 uses a communication line (feeder line) of the track 4, for example, to communicate with any one of the area controllers 50A, 50B, 50C. Herein, the transport vehicle 6 may communicate with any one of the area controllers 50A, 50B, 50C via an electric supply line provided along the track 4. The transport vehicle 6 includes a body frame 22, a cross-feeder 24, a θ drive 26, a lifting driver 28, a lifting platform 30, and a fall-prevention cover 33.

The cross-feeder 24 laterally feeds the θ drive 26, the lifting driver 28, and the lifting platform 30 all together in a direction orthogonal or substantially orthogonal to the traveling direction of the track 4. The θ drive 26 turns at least either one of the lifting driver 28 and the lifting platform 30 within a predetermined angle range in a horizontal plane. The lifting driver 28 winds or pays out suspensions, for example, wires, ropes, and belts, to raise or lower the lifting platform 30. The lifting platform 30 is provided with a chuck to hold or release an article 10. The fall-prevention cover 33 is provided in a pair to the front and the rear of the transport vehicle 6 in the traveling direction. The fall-prevention cover 33 extends and retracts claws (not illustrated), for example, to prevent the article 10 from falling during conveyance.

Each placement unit 8 to and from which a transport vehicle 6 delivers and receives an article 10 includes a buffer 8A and a delivery port 8B. The buffer 8A is a placement unit on which the article 10 is temporarily placed. For example, on the buffer 8A, an article 10 being conveyed by the transport vehicle 6 is temporarily placed when the article 10 is not able to be transferred onto a delivery port 8B as a destination, for example, when another article 10 has already been placed on the delivery port 8B. The delivery port 8B is a placement unit to deliver and receive an article 10 to and from a semiconductor processing device 12 including, for example, cleaning equipment, deposition equipment, lithography equipment, etching equipment, thermal treatment equipment, and planarization equipment. Herein, the processing device 12 is not limited to a particular one, and may be a device of various types or a stocker, for example.

Each placement unit 8 is provided along the track 4, and is provided in a position where an article 10 is able to be delivered to and received from a transport vehicle 6. For example, the buffer 8A is located beside the track 4 (see FIG. 2). In this case, the transport vehicle 6 laterally feeds the lifting driver 28, for example, with the cross-feeder 24, and slightly raises and lowers the lifting platform 30 to deliver and receive the article 10 to and from the buffer 8A. The buffer 8A may be located directly below the track 4. For example, the delivery port 8B is located directly below the track 4 (see FIG. 2). In this case, the transport vehicle 6 raises and lowers the lifting platform 30 to deliver and receive the article 10 to and from the delivery port 8B. The delivery port 8B may be located beside and below the track 4.

The area controllers 50A, 50B, 50C are each an electronic controller including a central processing unit (CPU), a read-only memory (ROM), and a random-access memory (RAM). The area controllers 50A, 50B, 50C each may be defined by, for example, software including a program stored in the ROM and loaded into the RAM to be executed by the CPU. The area controllers 50A, 50B, 50C each may be implemented as hardware, for example, an electronic circuit.

The area controllers 50A, 50B, 50C are provided to the areas A1, A2, A3, respectively. The respective area controllers 50A, 50B, 50C are provided to correspond to the respective areas A1, A2, A3. Specifically, the area controllers 50A, 50B, 50C consider the areas A1, A2, A3 respectively as jurisdiction areas, which are areas that the area controllers 50A, 50B, 50C are in charge of controlling. In other words, one area controller considers one area as its jurisdiction area. The number of the area controllers is preferably the same as the number of the areas, for example. Thus, one area controller considers any one of the areas as its jurisdiction area.

The area controller 50A communicates with a plurality of transport vehicles 6 in the jurisdiction area A1 (hereinafter, also called "its first jurisdiction area A1") of the area controller 50A to control the transport vehicles 6 in its first jurisdiction area A1. In other words, the area controller 50A controls the transport vehicles 6 in the jurisdiction area A1 to execute various instructions. Similar to the area controller 50A, the area controller 50B communicates with a plurality of transport vehicles in its first jurisdiction area A2 to control the transport vehicles 6 in its first jurisdiction area A2. Also similar to the area controller 50A, the area controller 50C communicates with a plurality of transport vehicles 6 in its first jurisdiction area A3 to control the transport vehicles 6 in its first jurisdiction area A3. The area controllers 50A, 50B, 50C communicate with the host controller 60 by wire or radio.

The host controller 60 is an electronic controller including a CPU, a ROM, and a RAM. The host controller 60 may be defined by, for example, software including a program stored in the ROM is loaded into the RAM to be executed by the CPU. The host controller 60 may be implemented as hardware, for example, an electronic circuit. The host controller 60 communicates with any one of the area controllers 50A, 50B, 50C by wire or radio, and transmits to any one of the area controllers 50A, 50B, 50C a conveyance instruction to control a transport vehicle 6 to convey an article 10. In the present preferred embodiment, the host controller 60 outputs to any one of the area controllers 50A, 50B, 50C a conveyance instruction (the conveyance source of which is a placement unit 8) to convey an article 10 placed on the placement unit 8 to another predetermined placement unit 8.

In FIG. 1, a layout of the track 4 according to the present preferred embodiment is illustrated. In the present preferred embodiment, the track 4 includes intra-bay traveling paths 42, 43 respectively provided in the areas A2, A3 and one inter-bay traveling path 41 that provides a communication path between the two intra-bay traveling paths 42, 43. The transport vehicles 6 are able to travel between the two intra-bay traveling paths 42, 43 by travelling on the inter-bay traveling path 41. According to the structure of the intra-bay traveling paths 42, 43 and the inter-bay traveling path 41, the transport vehicles 6 travel in one direction clockwise (directions indicated by arrows in FIG. 1 and FIG. 3).

In the predetermined traveling direction of the transport vehicles 6, when a location where a track 4 branches off is a branch portion B, a location where tracks 4 merge is a merging portion C, and a boundary between areas is a boundary portion D, a track portion that is located between any pair among the branch portion B, the merging portion C, and the boundary portion D is defined as a "section".

In the system as described above in which various operations of the transport vehicles 6 that are present in the areas A1, A2, A3 are controlled respectively by the area controllers 50A, 50B, 50C, in one area, there is a section that is not able to be entered without passing through another area that is different from the one area. This section is defined as "special section". In the layout of the track 4 illustrated in FIG. 1, a section, in the area A2, which is not able to be entered without passing through the other area A1 different from the area A2 (section extending from a boundary portion D to the merging portion C in the traveling direction of the transport vehicles 6) and a section, in the area A3, which is not able to be entered without passing through the other area A1 different from the area A3 (section extending from a boundary portion D to the merging portion C in the traveling direction of the transport vehicles 6) correspond to special sections (see FIG. 3).

Figure 3:
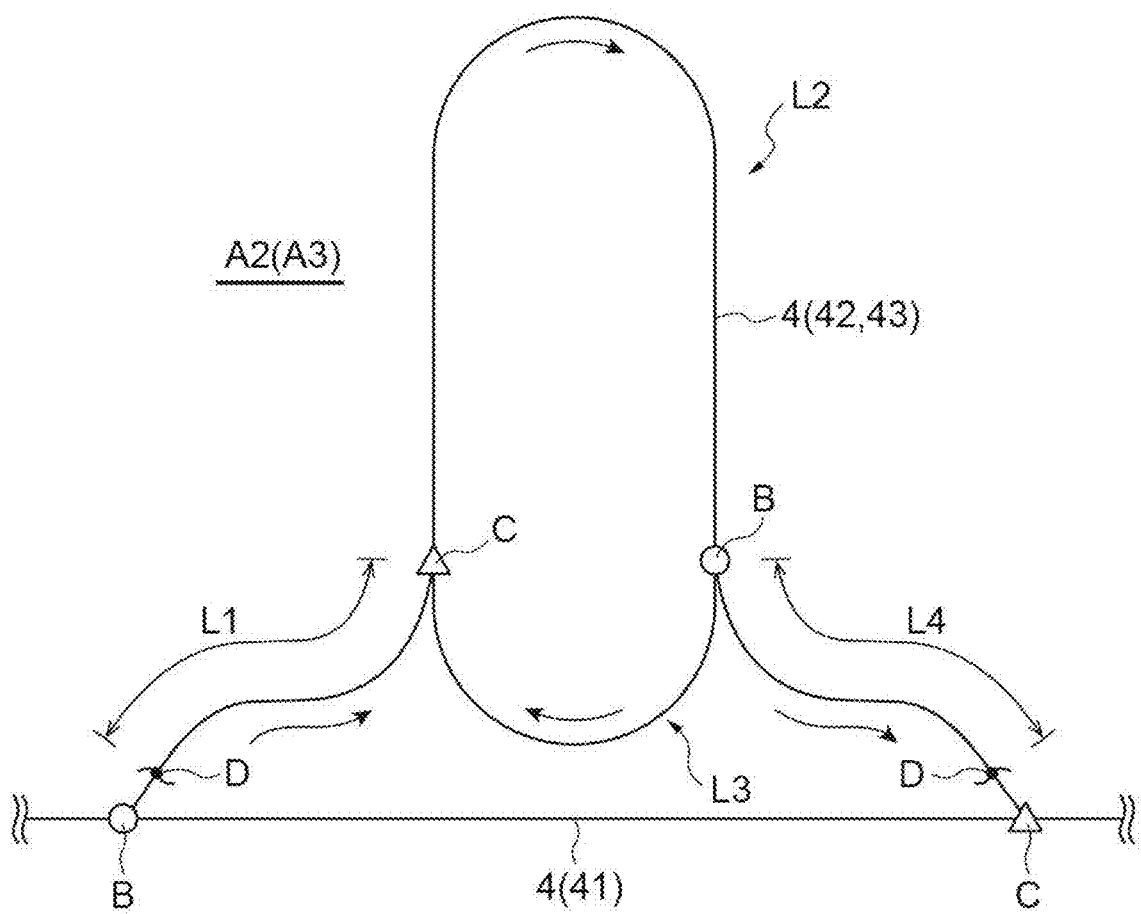
FIG. 3 is a plan view for describing a special section and non-special section in an area of the transport vehicle system shown in FIG. 1.

As illustrated in FIG. 3, in each of the areas A2, A3, in the traveling direction of the transport vehicles 6, a section L2 extending from a merging portion C to a branch portion B, a section L3 extending from the branch portion B to the merging portion C, and a section L4 extending from the branch portion B to a boundary portion D are provided. The sections L2, L3, L4 are able to be entered from another section in the same area. For example, in the area A2, the section L2 is able to be entered from both the section L1 and the section L3 in the same area A2. The section L3 and the section L4 are able to be entered from the section L2 in the same area A2. In the present preferred embodiment, the sections L2, L3, L4 are defined as non-special sections.

In the section L1, which is a special section in each of the areas A2, A3 (hereinafter, called "special section L1"), placement units 8 are provided along this section. As illustrated in FIG. 1, in the present preferred embodiment, three placement units 8, 8, 8 are provided. In the present preferred embodiment, these placement units 8 belonging to the special section L1 are referred to as special placement units 80A, 80B, 80C from the upstream in the predetermined traveling direction of the transport vehicles 6.

The following describes operation of the area controllers 50B, 50C in the above-described layout of the track 4. The area controller 50B (50C), in response to receiving from the host controller 60 a conveyance instruction (the conveyance source of which is the special placement unit 80C) to convey to a predetermined placement unit 8 an article 10 placed on one special placement unit (e.g., 80C) of the first jurisdiction area A2 (A3) that is its first jurisdiction area, transmits a movement instruction to control a transport vehicle 6 that is empty to move toward the first jurisdiction area A2 (A3) to the other area controller 50A configured to control a transport vehicle 6 in the area A1 that is adjacent to the special section L1 where the special placement unit 80C is positioned. The transport vehicle 6 that is empty (hereinafter, called "empty transport vehicle 6") indicates a transport vehicle that is not loaded with (holds) any article 10 and is able to be loaded with an article 10.

The area controller 50B (50C) in the present preferred embodiment detects whether an empty transport vehicle 6 is present in the first jurisdiction area A2 (A3) and upstream of the one special placement unit 80C before transmitting the movement instruction to the other area controller 50A. The area controller 50B (50C) transmits the above-described movement instruction to the area controller 50A only when an empty transport vehicle 6 is not present in the first jurisdiction area A2 (A3) or upstream of the one special placement unit 80C. If an empty transport vehicle 6 is present in the first jurisdiction area A2 (A3) and upstream of the one special placement unit 80C, the area controller 50B (50C) controls this empty transport vehicle 6 to execute the conveyance instruction.

If the area controller 50B (50C) detects that an empty transport vehicle 6 has become available in the first jurisdiction area A2 (A3) after transmission of the above-described movement instruction, the area controller 50B (50C) controls the empty transport vehicle 6 in the first jurisdiction area A2 (A3) to execute the conveyance instruction. The expression "after transmission" herein includes a meaning of "at substantially the same time". Candidates for an empty transport vehicle 6 in the first jurisdiction area A2(A3) to be detected after transmission of the movement instruction by the area controller 50B (50C) include an empty transport vehicle 6 that enters the first jurisdiction area A2 (A3) from the second jurisdiction area A1 and an empty transport vehicle 6 that becomes available by placing an article 10 onto a placement unit 8 belonging to the first jurisdiction area A2 (A3) (by completing a conveyance instruction). After controlling the empty transport vehicle 6 that has become available in the first jurisdiction area A2 (A3) to execute the conveyance instruction, the area controller 50B (50C) transmits to the other area controller 50A an instruction to delete the movement instruction transmitted to the other area controller 50A.

The following describes one example of processes performed by the transport vehicle system 1 with reference to sequence diagrams in FIG. 4 to FIG. 7. Processes when a conveyance instruction (the conveyance source of which is the special placement unit 80C) to convey an article 10 placed on the special placement unit 80C in the area A2 to a predetermined placement unit 8 are described below. In the following, a procedure of operation of the one area controller 50B among the area controllers 50A, 50B, 50C is described.

Figure 4:
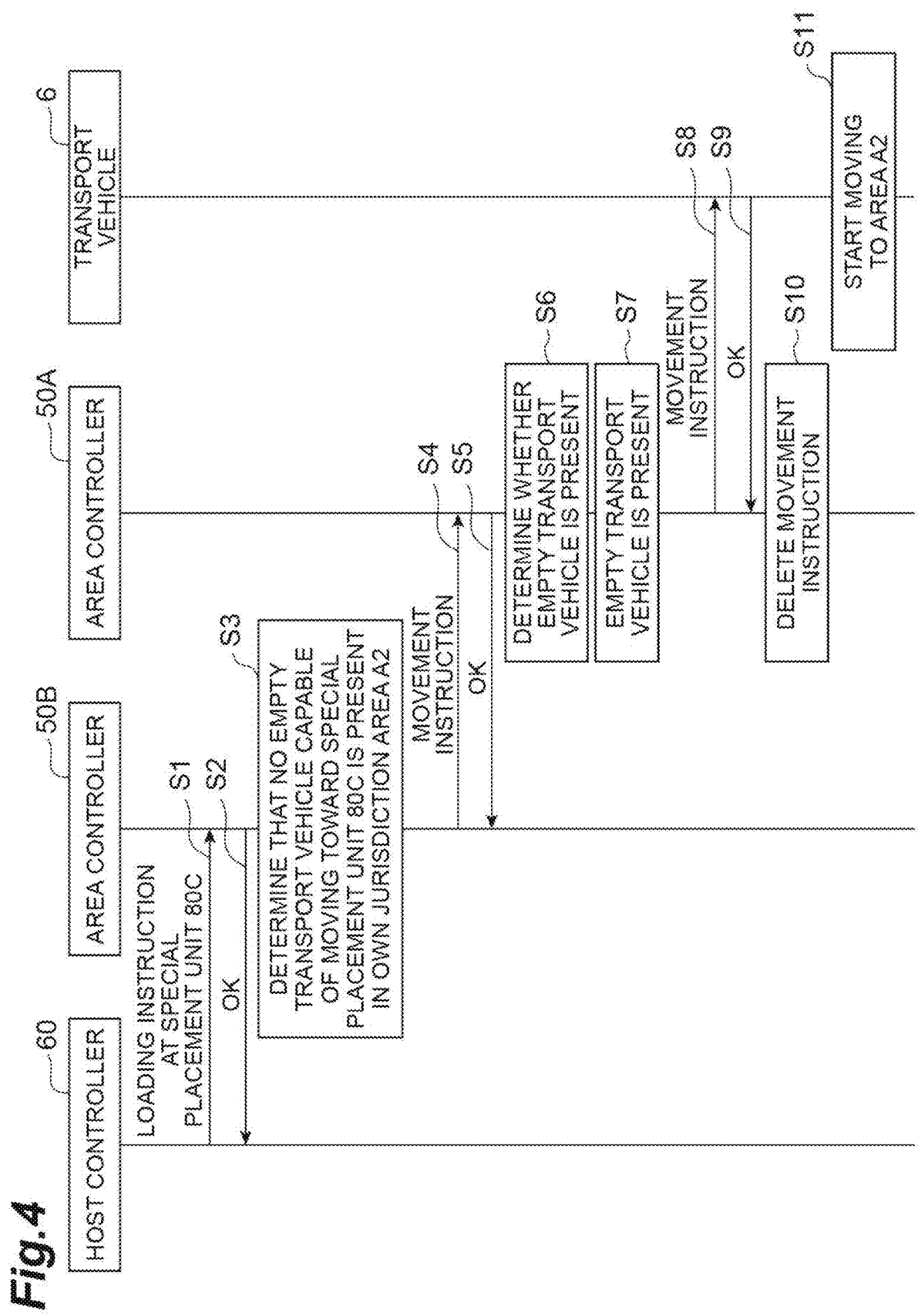
FIG. 4 is a sequence diagram of the transport vehicle system shown in FIG. 1.

As illustrated in FIG. 4, the host controller 60 transmits, as a conveyance instruction, a loading instruction at the special placement unit 80C in the area A2 to the area controller 50B having jurisdiction over the area A2 (step S1). The area controller 50B, in response to receiving the loading instruction from the host controller 60, transmits to the host controller 60 a signal to notify it of having received the loading instruction (step S2). The area controller 50B detects whether an empty transport vehicle 6 capable of moving toward the special placement unit 80C is present in the first jurisdiction area A2 (step S3). Hereinafter, description is made on the assumption that such an empty transport vehicle 6 has been determined to be absent in the first jurisdiction area A2.

The area controller 50B transmits a movement instruction destined for the area A2 to the area controller 50A having jurisdiction over the area A1 that is different from the first jurisdiction area A2 (step S4). The area controller 50A, in response to receiving the movement instruction from the area controller 50B, transmits to the area controller 50B a signal to notify the area controller 50B of having received the movement instruction (step S5). The area controller 50A determines whether an empty transport vehicle 6 is present in the first jurisdiction area A1 (step S6). The area controller 50A continuously communicates with all transport vehicles 6 that are present in the first jurisdiction area A1 at predetermined intervals (e.g., several times per second), and receives a status report from each transport vehicle 6. The area controller 50A determines the states of all the transport vehicles 6 based on such status reports, and thus is able to determine whether an empty transport vehicle 6 is present in the first jurisdiction area A1.

The following describes a case when the area controller 50A has determined that an empty transport vehicle 6 is present in the first jurisdiction area A1 (step S7). A case when the area controller 50A has determined that no empty transport vehicle 6 is present will be described below.

If the area controller 50A determines that an empty transport vehicle 6 is present in the first jurisdiction area A1, the area controller 50A transmits to this empty transport vehicle 6 a movement instruction to move toward the area A2 (step S8). The transport vehicle 6, in response to receiving the movement instruction from the area controller 50A, transmits to the area controller 50A a signal to notify it of having received the movement instruction (step S9), and starts moving toward the area A2 (step S11). The area controller 50A, in response to receiving the signal to notify it of having received the movement instruction from the transport vehicle 6, deletes the movement instruction stored in a memory (not illustrated) that the area controller 50A includes (step S10).

Figure 5:
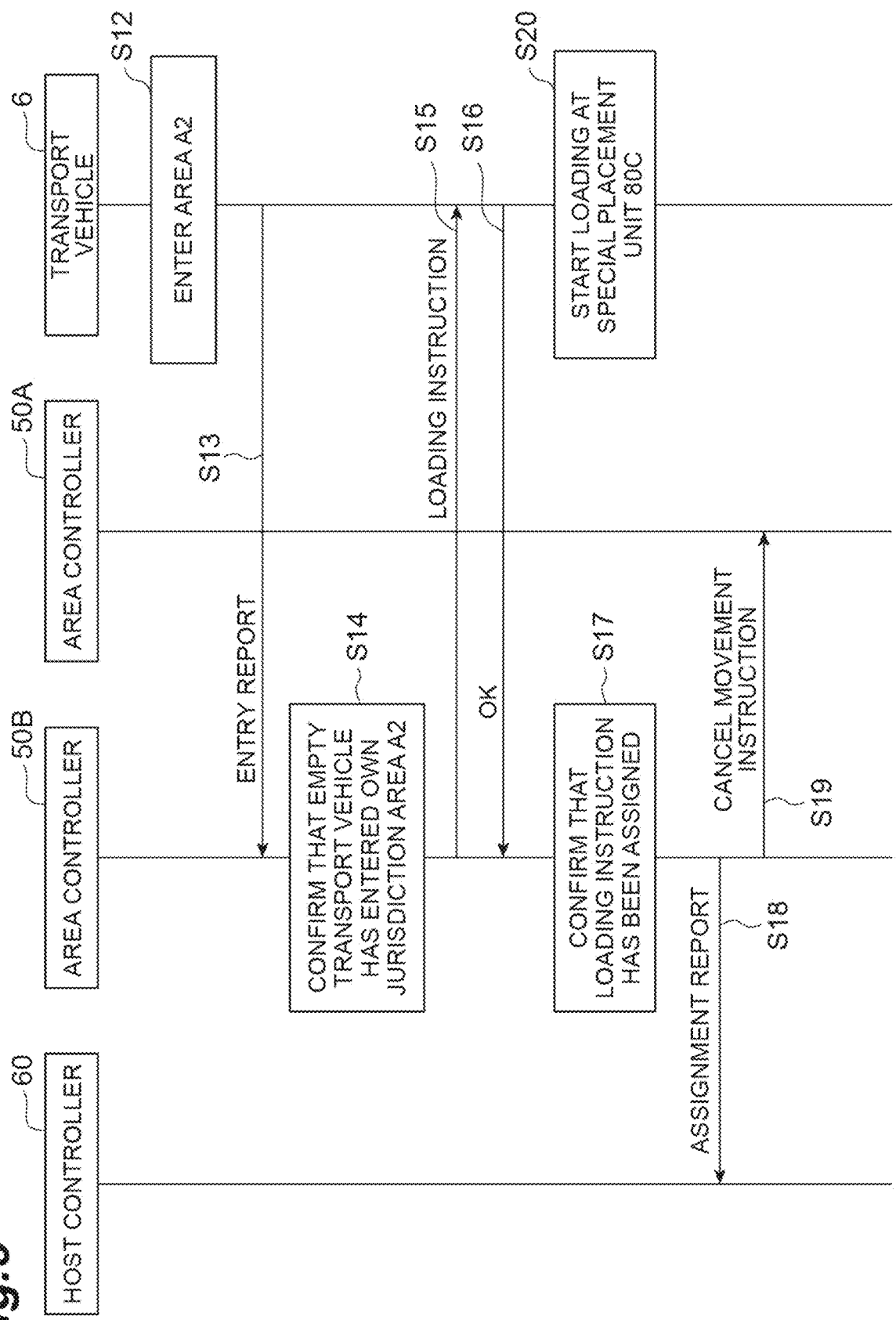
FIG. 5 is a sequence diagram of the transport vehicle system shown in FIG. 1.

As illustrated in FIG. 5, the transport vehicle 6 executes the movement instruction transmitted at step S8, and thus enters the area A2 (step S12). The transport vehicle 6 assigned with the movement instruction transmits a request for entry into the area A2 to the area controller 50A. The area controller 50A communicates with the area controller 50B, and also transmits an entry permission to the transport vehicle 6. The transport vehicle 6 enters the area A2 and transmits an entry report to the area controller 50B (step S13), and the area controller 50B confirms (is notified) that the transport vehicle 6 has entered (step S14). The entry report into the area A2 is also transmitted to the area controller 50A via the area controller 50B.

The area controller 50B, after confirming that the empty transport vehicle 6 has entered the first jurisdiction area A2, transmits an instruction to be loaded with the article 10 placed on the special placement unit 80C to the transport vehicle 6 that has entered the area A2 (step S15). The transport vehicle 6, in response to receiving this loading instruction from the area controller 50B, transmits to the area controller 50B a signal to notify the area controller 50B of having received the loading instruction (step S16), and continues moving toward the special placement unit 80C. The transport vehicle 6 that has reached the special placement unit 80C is loaded with the article 10 placed on the special placement unit 80C, and conveys the article 10 to a predetermined location (step S20). Herein, in the conveyance instruction including the loading instruction, information on a conveyance destination of the article 10 is included.

The area controller 50B receives the signal to notify the area controller 50B of having received the loading instruction from the transport vehicle 6, thus confirming that the loading instruction has been assigned to the transport vehicle 6 (step S17). Subsequently, the area controller 50B transmits an assignment report to the host controller 60 (step S18), and also causes the area controller 50A to cancel the movement instruction transmitted thereto (step S19). In the present preferred embodiment, because the movement instruction stored in the memory of the area controller 50A has already been deleted in the process at step S10, no process will be performed in accordance with the movement instruction at step S19. Thus, a series of processes when a conveyance instruction to convey the article 10 placed on the special placement unit 80C in the area A2 to the predetermined placement unit 8 has been issued ends.

Figure 6:
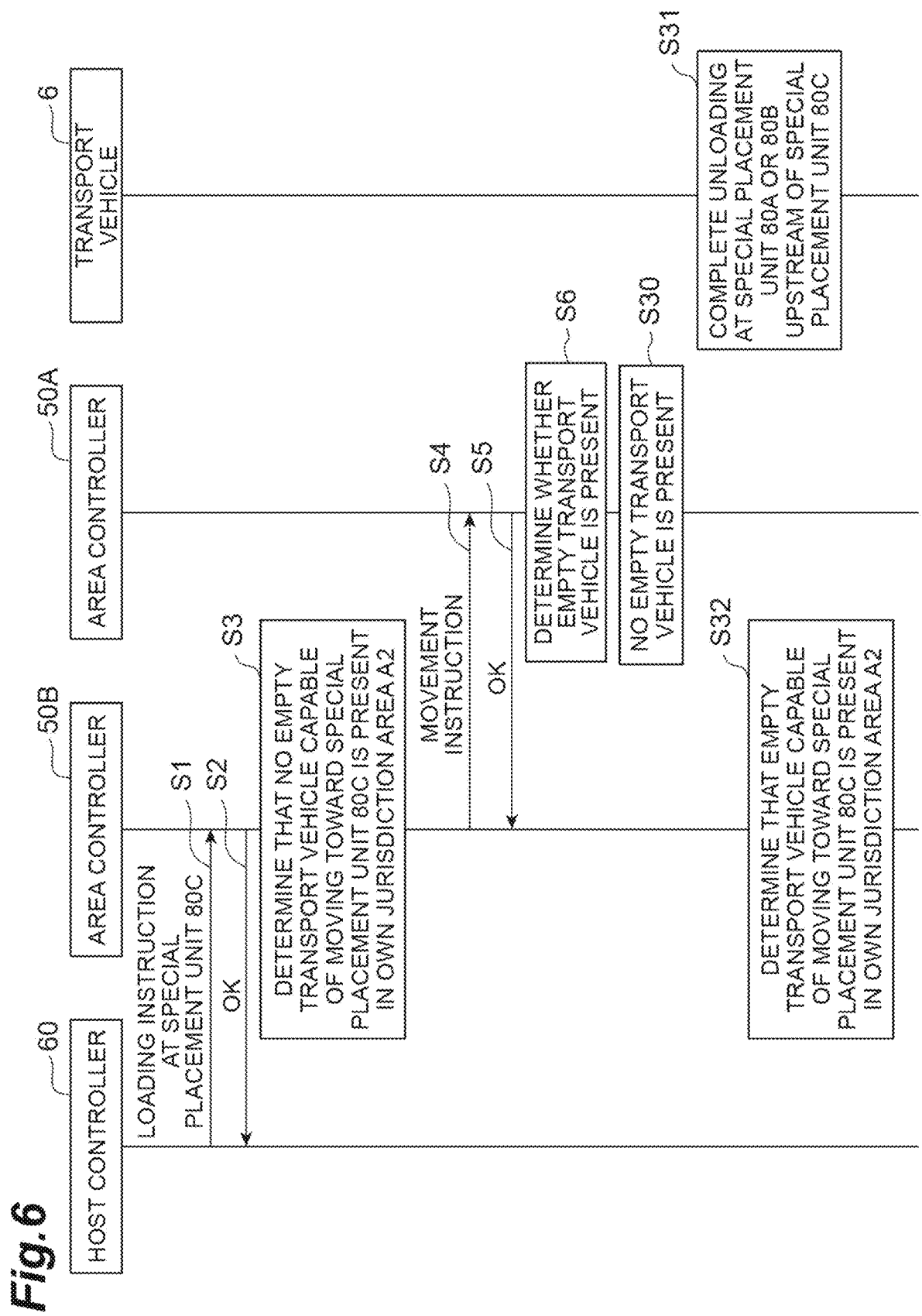
FIG. 6 is a sequence diagram of the transport vehicle system shown in FIG. 1.
Figure 7:
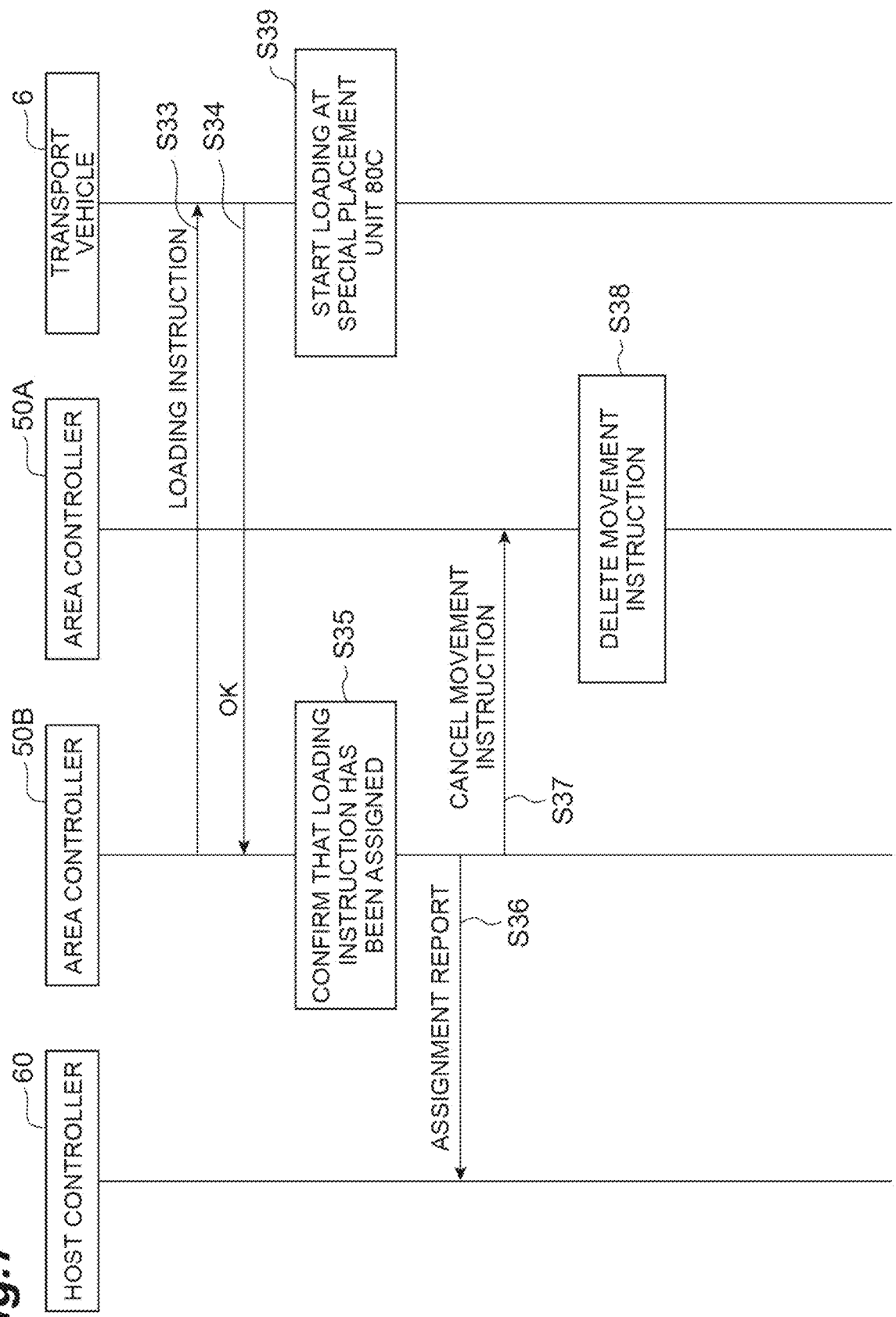
FIG. 7 is a sequence diagram of the transport vehicle system shown in FIG. 1.

The following describes a case when the area controller 50A has determined at step S6 that no empty transport vehicle 6 is present with reference to FIG. 6 and FIG. 7. Because processes up to step S6 are the same as those described above, duplicate description is omitted. As illustrated in FIG. 6, if the area controller 50A determines that no empty transport vehicle 6 is present in the first jurisdiction area A1 (step S30), the area controller 50A is not able to issue a movement instruction to a transport vehicle 6. Thus, the area controller 50A continues monitoring the first jurisdiction area A1 with the movement instruction being stored in the memory thereof.

Herein, at the special placement unit 80A or 80B upstream of the special placement unit 80C in the area A2, when a transport vehicle 6 has been unloaded with an article 10 (step S31), this empty transport vehicle 6 newly becomes available in the area A2, and thus an empty transport vehicle 6 becomes present. Thus, the area controller 50B monitoring the area A2 determines that an empty transport vehicle 6 able to move toward the special placement unit 80C is present in the first jurisdiction area A2 (step S32).

As illustrated in FIG. 7, the area controller 50B transmits a loading instruction at the special placement unit 80C to the empty transport vehicle 6 that has newly become available in the area A2 (step S33). The transport vehicle 6, in response to receiving the loading instruction from the area controller 50B, transmits a signal to notify the area controller 50B of having received the loading instruction to the area controller 50B (step S34), and starts moving toward the special placement unit 80C. The transport vehicle 6 that has reached the special placement unit 80C is loaded with the article 10 placed on the special placement unit 80C, and conveys the article 10 to a predetermined location (step S39). Herein, in the conveyance instruction including the loading instruction, information on a conveyance destination of the article 10 is included.

The area controller 50B, after receiving the signal to notify area controller 50B of having received the loading instruction from the transport vehicle 6, confirms that the loading instruction has been assigned to the transport vehicle 6 (step S35). Subsequently, the area controller 50B transmits an assignment report to the host controller 60 (step S36), and also controls the area controller 50A to cancel the movement instruction (step S37). In other words, the movement instruction stored in the memory of the area controller 50A is deleted (step S38). Thus, a series of processes when a conveyance instruction to convey the article 10 placed on the special placement unit 80C in the area A2 to the predetermined placement unit 8 has been issued ends.

Although detailed description is omitted, the area controller 50C also implements the same or similar procedure of operation as the area controller 50B.

The following describes features of the transport vehicle system 1 according to the preferred embodiment described above. A transport vehicle system 1 in which the area controllers 50A, 50B, 50C respectively consider the areas A1, A2, A3 as the jurisdiction areas A1, A2, A3 and control various operations of transport vehicles 6 has problems described below. Specifically, each area controller 50B (50C) of the transport vehicle system 1, even after receiving a conveyance instruction destined for the special placement unit 80C in the first jurisdiction area A2 (A3), is not able to control a transport vehicle 6 to move to the special placement unit 80C to be loaded in most cases. Thus, a conventional host controller 60 transmits the conveyance instruction to the other area controller 50A having jurisdiction over the other area A1, and this other area controller 50A controls an empty transport vehicle 6 in the jurisdiction area A1 to execute the conveyance instruction.

However, in this case, even if an empty transport vehicle 6 has become available in the special section L1 of the area A2 (A3) before a transport vehicle 6 in the second jurisdiction area A1 reaches the special placement unit 80C, the other area controller 50A that has received the conveyance instruction is not able to control the transport vehicle 6 that has become available in the area A2 over which it has no jurisdiction. Thus, the transport vehicle 6 in the first jurisdiction area A2 (A3) instead passes by the special placement unit 80C even though the transport vehicle 6 is not loaded with an article 10 (that is, the transport vehicle 6 is empty). Accordingly, the conveyance efficiency is reduced, and the handling time is increased.

In the transport vehicle system 1 according to the preferred embodiment described above, when a conveyance instruction the conveyance source of which is the special placement unit 80C in the area A2 (A3) has been issued, the host controller 60 first transmits the conveyance instruction to the area controller 50B (50C) having jurisdiction over the area A2 (A3) to which the special placement unit 80C belongs, instead of transmitting the conveyance instruction to the other area controller 50A to which the special placement unit 80C does not belong. The area controller 50B (50C) that has received the conveyance instruction transmits, to the other area controller 50A, a movement instruction to cause an empty transport vehicle 6 to move toward the area A2. According to the processes described above, the area controller 50B (50C) having jurisdiction over the area A2 (A3) to which the special placement unit 80C belongs is able to control a transport vehicle 6 to execute the conveyance instruction, and the conveyance instruction is able to be assigned to both of a transport vehicle 6 (a transport vehicle 6 in the second jurisdiction area A1) that is going to enter the area A2 (A3) in accordance with the preceding movement instruction and an empty transport vehicle 6 that becomes available in the area A2 (A3). Therefore, a reduction of the conveyance efficiency described above is able to be significantly reduced or prevented, and thus even when a conveyance instruction the conveyance source of which is a placement unit belonging to the special section L1 has been issued, this conveyance instruction is able to be handled efficiently.

In the transport vehicle system 1 according to the preferred embodiment described above, the area controller 50B (50C) deletes the movement instruction transmitted to the area controller 50A after causing the empty transport vehicle 6 that has become available in the first jurisdiction area A2 (A3) to execute the conveyance instruction. Accordingly, at the time when an empty transport vehicle 6 has become available in the area A2 (A3), movement of an empty transport vehicle 6 traveling toward the first jurisdiction area A2 (A3) is able to be canceled, and thus influence on the conveying capability in the other area A1 is able to be significantly reduced.

In the transport vehicle system 1 according to the preferred embodiment described above, the area controller 50B (50C) detects whether an empty transport vehicle 6 is present in the first jurisdiction area A2 (A3) before transmitting the movement instruction to the area controller 50A. Accordingly, before transmitting the movement instruction to the other area controller 50A, a necessity of the transmission of the movement instruction is able to be checked, and thus influence on the conveying capability in the other area A1 is able to be significantly reduced.

In the transport vehicle system 1 according to the preferred embodiment described above, the area controller 50B (50C) detects whether an empty transport vehicle 6 is present in the first jurisdiction area A2 (A3) and upstream of the one special placement unit 80C before transmitting the movement instruction to the other area controller 50A. Accordingly, a check range of the necessity to transmit the movement instruction to the other area controller 50A is able to be significantly reduced, and a handling speed is able to be significantly improved.

Although preferred embodiments of the present invention have been described above, the present invention is not limited to the preferred embodiments, and various modifications may be made within the scope not departing from the gist of the present invention.

In the preferred embodiments described above, an example of control performed in layout of the track 4 as illustrated in FIG. 1 has been described. However, the layout is not limited to this. Preferred embodiments of the present invention may be applied to any layout of the track 4 if the layout of the track 4 has a special section L1.

In the preferred embodiments described above, an example has been described in which the area controller 50B (50C), in response to receiving from the host controller 60 a conveyance instruction destined for the one special placement unit 80C in the first jurisdiction area A2 (A3), transmits a movement instruction to the one area controller 50A. However, the area controller 50B (50C) may transmit the movement instruction to a plurality of other area controllers. This modification may be implemented, for example, in a layout in which a merging portion is closer to the starting point of each special section L1. Accordingly, even if the layout in which a merging portion is closer to the starting point of each special section L1 is provided, the movement instruction may be transmitted to a predetermined one of the other area controllers. Furthermore, the area controller 50B (50C) may transmit the movement instruction to area controllers having jurisdiction over not only the adjacent areas but also areas that are adjacent to the adjacent areas, for example, if the number of empty transport vehicles is relatively small.

In the preferred embodiments described above, an example has been described in which the area controller 50B (50C) transmits the movement instruction to the area controller 50A only when an empty transport vehicle 6 is not present in the first jurisdiction area A2 (A3) or upstream of the one special placement unit 80C. However, the present invention is not limited to this. For example, the area controller 50B (50C) may transmit the movement instruction to the other area controller 50A without confirming that an empty transport vehicle 6 is present in the first jurisdiction area A2 (A3) and upstream of the one special placement unit 80C. Even in this case, the movement instruction is deleted as soon as an empty transport vehicle 6 is found in the first jurisdiction area A2 (A3), and thus influence on the other area A1 is able to be significantly reduced.

The transport vehicle systems 1 according to the preferred embodiments and the modifications have been described in which the traveling vehicles are transport vehicles 6 as one example. However, other examples of the traveling vehicles include automated guided traveling vehicles and stacker cranes configured to travel on a track installed on the ground or abutments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transport vehicle system comprising:
a track that extends over a plurality of areas;
a plurality of transport vehicles that are able to travel in one direction along the track;
a plurality of placement units provided along the track to deliver or receive an article to or from the placement units for each of the plurality of transport vehicles; and
a plurality of area controllers that each receive, from a host controller, a conveyance instruction to convey an article placed on one of the placement units, determine the corresponding one of the areas as a jurisdiction area, and control the transport vehicle in the jurisdiction area to execute various instructions; wherein
in one jurisdiction area, the placement unit belonging to a special section unable to be entered without passing through another jurisdiction area different from the one jurisdiction area is a special placement unit, and each area controller, in response to receiving from the host controller the conveyance instruction destined for the special placement unit belonging to a first jurisdiction area that is a jurisdiction area of the area controller, transmits a movement instruction to control an empty transport vehicle to move toward the first jurisdiction area to another area controller that controls the transport vehicle in a second jurisdiction area, and also controls an empty transport vehicle that has become available in the first jurisdiction area after transmission of the movement instruction to execute the conveyance instruction.

2. The transport vehicle system according to claim 1, wherein the empty transport vehicle in the first jurisdiction area to be detected by the area controller after the transmission of the movement instruction is an empty transport vehicle that enters the first jurisdiction area from the second jurisdiction area or an empty transport vehicle that becomes available by placing an article onto the special placement unit belonging to the first jurisdiction area.

3. The transport vehicle system according to claim 2, wherein the area controller deletes the movement instruction transmitted to the other area controller after controlling the empty transport vehicle that has become available in the first jurisdiction area to execute the conveyance instruction.

4. The transport vehicle system according to claim 2, wherein the area controller detects whether an empty transport vehicle is present in the first jurisdiction area before transmitting the movement instruction to the other area controller.

5. The transport vehicle system according to claim 4, wherein the area controller detects whether an empty transport vehicle is present in the first jurisdiction area and upstream of the special placement unit before transmitting the movement instruction to the other area controller.

6. The transport vehicle system according to claim 1, wherein the area controller deletes the movement instruction transmitted to the other area controller after controlling the empty transport vehicle that has become available in the first jurisdiction area to execute the conveyance instruction.

7. The transport vehicle system according to claim 6, wherein the area controller detects whether an empty transport vehicle is present in the first jurisdiction area before transmitting the movement instruction to the other area controller.

8. The transport vehicle system according to claim 7, wherein the area controller detects whether an empty transport vehicle is present in the first jurisdiction area and upstream of the special placement unit before transmitting the movement instruction to the other area controller.

9. The transport vehicle system according to claim 1, wherein the area controller detects whether an empty transport vehicle is present in the first jurisdiction area before transmitting the movement instruction to the other area controller.

10. The transport vehicle system according to claim 9, wherein the area controller detects whether an empty transport vehicle is present in the first jurisdiction area and upstream of the special placement unit before transmitting the movement instruction to the other area controller.

* * * * *